(12) United States Patent
Boivin et al.

(10) Patent No.: US 9,425,239 B2
(45) Date of Patent: Aug. 23, 2016

(54) VERTICAL TRANSISTOR FOR RESISTIVE MEMORY

(71) Applicant: STMICROELECTRONICS (ROUSSET) SAS, Rousset (FR)

(72) Inventors: Philippe Boivin, Venelles (FR); Julien Delalleau, Aix-en-Provence (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 14/737,372

(22) Filed: Jun. 11, 2015

(65) Prior Publication Data
US 2016/0013245 A1    Jan. 14, 2016

(30) Foreign Application Priority Data

Jul. 11, 2014 (FR) ..................................... 14 56740

(51) Int. Cl.

| | |
|---|---|
| H01L 27/24 | (2006.01) |
| H01L 43/02 | (2006.01) |
| H01L 43/08 | (2006.01) |
| H01L 43/12 | (2006.01) |
| H01L 45/00 | (2006.01) |
| H01L 27/22 | (2006.01) |
| H01L 23/528 | (2006.01) |
| H01L 29/423 | (2006.01) |
| H01L 21/265 | (2006.01) |
| H01L 21/762 | (2006.01) |
| H01L 27/115 | (2006.01) |
| H01L 29/78 | (2006.01) |

(52) U.S. Cl.
CPC ...... *H01L 27/2454* (2013.01); *H01L 21/26513* (2013.01); *H01L 21/76224* (2013.01); *H01L 23/528* (2013.01); *H01L 27/11507* (2013.01); *H01L 27/228* (2013.01); *H01L 27/2463* (2013.01); *H01L 29/42356* (2013.01); *H01L 29/7827* (2013.01); *H01L 43/02* (2013.01); *H01L 43/08* (2013.01); *H01L 43/12* (2013.01); *H01L 45/1233* (2013.01); *H01L 45/16* (2013.01); *H01L 45/04* (2013.01); *H01L 45/06* (2013.01); *H01L 45/085* (2013.01)

(58) Field of Classification Search
None
See application file for complete search history.

(56) References Cited

U.S. PATENT DOCUMENTS

| | | |
|---|---|---|
| 2002/0079527 A1 | 6/2002 | Schlosser et al. |
| 2012/0135573 A1 | 5/2012 | Kim |
| 2013/0037872 A1 | 2/2013 | Sun et al. |
| 2014/0138600 A1 | 5/2014 | Satoh et al. |
| 2014/0138609 A1 | 5/2014 | Satoh et al. |

*Primary Examiner* — Scott B Geyer
(74) *Attorney, Agent, or Firm* — Seed IP Law Group PLLC

(57) ABSTRACT

The present disclosure relates to a memory on semiconductor substrate, comprising: at least one data line, at least one selection line, at least one reference line, at least one memory cell comprising a select transistor having a control gate connected to the selection line, a first conduction terminal connected to a variable impedance element, the select transistor and the variable impedance element coupling the reference line to the data line, the select transistor comprising an embedded vertical gate produced in a trench formed in the substrate, and a channel region opposite a first face of the trench, between a first deep doped region and a second doped region on the surface of the substrate coupled to the variable impedance element.

18 Claims, 8 Drawing Sheets

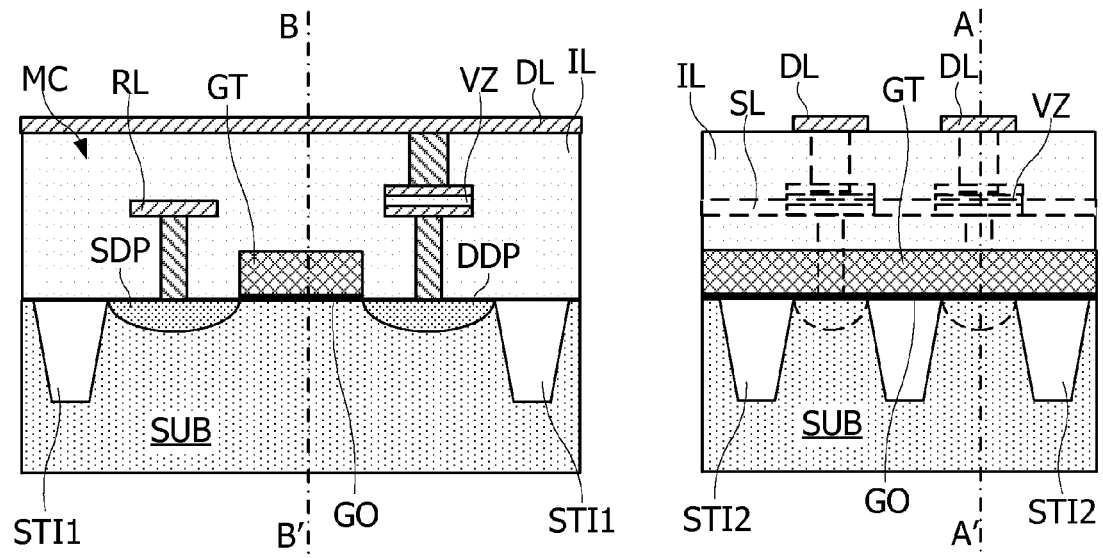
Fig. 1A
(Prior Art)
Fig. 1B
(Prior Art)
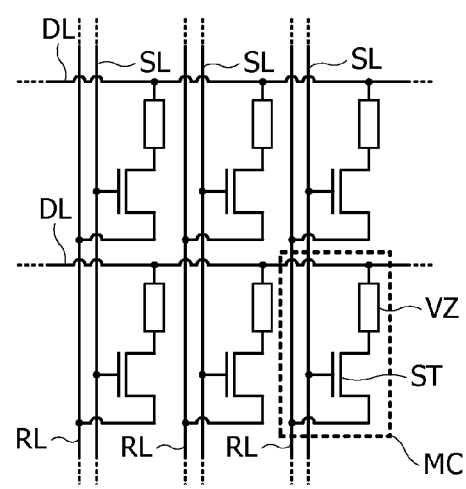
Fig. 2
(Prior Art)

VERTICAL TRANSISTOR FOR RESISTIVE MEMORY

BACKGROUND

1. Technical Field

The present disclosure relates to resistive memories, and more generally to memories in which each memory cell comprises a select transistor and a variable impedance element which can have several different states detectable by an impedance measurement. Depending on whether the element can keep its state with or without power supply, the memory is volatile or non-volatile.

2. Description of the Related Art

Thus, several types of resistive memories are being developed. In conductive-bridging random access memories (CBRAM), the variable impedance element comprises two electrodes and a thin layer of solid electrolyte arranged between the electrodes. Under the effect of biasing the element, metal ions migrate from one of the two electrodes and from the electrolyte to the other electrode, and form filaments which reduce the electrical resistance of the element.

Resistive RAM memories (RRAM or ReRAM) comprise a dielectric element which can be forced to be conductive in a reversible manner by forming conductive filaments obtained by applying a sufficiently high voltage.

In ferroelectric RAM memories (FeRAM or FRAM), the variable impedance element comprises a capacitor the dielectric of which is a ferroelectric material in which magnetic dipoles can be oriented along the field lines of an electric field formed between the electrodes when the capacitor is charged. When the capacitor discharges, the dipoles keep their orientation.

The variable impedance element of MRAM (Magnetoresistive RAM) memories comprises two plates made of ferromagnetic material which can produce an electric field, separated by a dielectric film. One of the plates is a permanent magnet, whereas the other plate generates a magnetic field which can be modified by an electric current. The state of the memory cell is read by an impedance measurement.

Certain so-called "phase change" memories use as variable resistive element a material which can take an amorphous or crystalline state under the effect of a temperature increase.

FIGS. 1A, 1B schematically represent a cross-section of a semiconductor substrate SUB in which a memory cell MC comprising a variable impedance element VZ is formed. FIG. 1A is a longitudinal cross-section along the plane AA' indicated on FIG. 1B, and FIG. 1B is a transverse cross-section along the plane BB' indicated on FIG. 1A. The memory cell MC comprises a select transistor comprising a gate GT, drain DDP and source SDP regions on either side of the gate GT, and a channel region beneath the gate GT between the drain DDP and source SDP regions. The gate GT is produced in a layer made of polycrystalline silicon formed on an insulating layer deposited on the substrate SUB. The regions DDP, SDP are formed by implanting dopants in the substrate SUB on each side of the gate GT. The memory cell MC is covered by a dielectric insulating material IL. The source region SDP is coupled to a reference line RL through a contact passing through the insulating layer IL. The gate GT forms a selection line SL extending in parallel to the reference line RL. The variable impedance element VZ is formed in the insulating layer IL and is coupled to the drain region DDP through a contact formed in the insulating layer IL. The variable impedance element VZ is coupled to a data line DL formed on the surface of the layer IL through a contact formed in the insulating layer IL. The data line DL is perpendicular to the reference RL and selection SL lines. The memory cell is isolated from the other memory cells by isolating trenches STI1 parallel to the gate GT, and isolating trenches STI2 perpendicular to the gate GT.

FIG. 2 represents the electric circuit of a part of a memory array comprising memory cells such as the memory cell MC represented on FIGS. 1A, 1B. The memory array comprises selection lines SL, reference lines RL parallel to the selection lines SL and data lines DL perpendicular to the selection lines SL and to the reference lines RL. Each memory cell MC comprises a select transistor ST comprising a conduction terminal (source or drain) connected to a terminal of a variable impedance element VZ the other terminal of which is connected to one of the data lines DL. The other conduction terminal of the select transistor ST is connected to one of the reference lines RL, and the gate terminal of the transistor ST is connected to one of the selection lines SL.

To reduce the surface area occupied by each memory cell, it has been proposed to produce the memory cells in pairs, sharing a same conduction region connected to a reference line. Thus, FIG. 3 represents a longitudinal cross-section of a pair of memory cells MC1, MC2 each comprising a select transistor ST1, ST2. The transistors ST1, ST2 share a same conduction region SDP connected to a reference line RL. Each select transistor ST1, ST2 comprises a gate GT, and another conduction region DDP connected to a variable impedance element VZ further connected to a data line DL common to the two memory cells MC1, MC2. Isolating trenches STI1 are produced between each pair of memory cells.

To reduce the surface area occupied by each memory cell, it has also been proposed to replace the isolating trenches STI1 with CMOS transistor gates formed on the substrate and connected to the ground, the substrate also being connected to the ground. Thus, FIG. 4 represents a memory cell MC3 identical to the memory cell MC, but in which the isolating trenches STI1 are replaced with transistor gates IG which may be narrower than the trenches STI1, and formed on a layer of gate oxide GO deposited on the substrate.

It is desirable to further reduce the substrate surface area occupied by a memory cell comprising a variable impedance element.

BRIEF SUMMARY

Some embodiments relate to a memory on semiconductor substrate, comprising: at least one data line, at least one selection line, at least one reference line, at least one memory cell comprising a select transistor having a control gate connected to the selection line, a first conduction terminal connected to a variable impedance element, the select transistor and the variable impedance element coupling the reference line to the data line. According to one embodiment, the select transistor comprises an embedded vertical gate produced in a trench formed in the substrate, and a channel region opposite a first face of the trench, between a first deep doped region and a second doped region on the surface of the substrate coupled to the variable impedance element.

According to one embodiment, the first deep doped region forms the reference line.

According to one embodiment, the memory comprises a third doped region formed in the substrate opposite a second face of the trench to prevent the opening of a transistor channel opposite the second face of the trench at voltages applied to control the memory cell.

According to one embodiment, the memory comprises a fourth doped region implanted in the vicinity of a second lateral face of the embedded gate, opposite the first lateral face, to favor the formation of a transistor channel at the control voltages applied to the memory cell, between the first deep doped region and the second doped region along the second lateral face of the gate.

According to one embodiment, the variable impedance element has the structure of a capacitor comprising electrodes and, between the electrodes, a solid electrolyte, or a dielectric material capable of forming filaments under the effect of a voltage applied between the electrodes, or a ferromagnetic material, or a material which can take amorphous and crystalline phases.

According to one embodiment, the vertical gate forms the selection line.

According to one embodiment, the memory cells are produced in mini-wells isolated from each other and from the rest of the substrate, the selection line being formed above and coupled to the control gates of a row of memory cells.

Some embodiments also relate to a method for manufacturing an integrated circuit comprising a memory comprising several memory cells, the method comprising steps of: implanting deep down in a semiconductor substrate a first doped region, producing a trench in the substrate, from an upper face of the substrate, and which reaches the first doped region, producing an embedded gate in the trench, implanting on a first side of the trench, in the vicinity of the upper surface of the substrate, a second doped region forming a first conduction region of a select transistor whose gate is the embedded gate and whose second conduction region is the first doped region, and forming a variable impedance element electrically coupled to the second doped region.

According to one embodiment, the first doped region forms a conduction region common to several select transistors of the memory cells.

According to one embodiment, the method comprises a step of implanting in the substrate via a lateral face of the trench of a second side opposite the first side, a third doped region suitable to prevent the opening of a transistor channel along the second side of the trench at usual control voltages applied to the memory cells.

According to one embodiment, the implantation in the substrate of the third doped region is performed via a lateral face of the trench.

According to one embodiment, the method comprises a step of implanting in the substrate via a lateral face of the trench of the first side of the trench, a fourth doped region suitable to favor the formation of a transistor channel at usual control voltages applied to the memory cells.

According to one embodiment, the fourth doped region is produced by implanting P-type dopants in the P-type substrate.

According to one embodiment, the implantation of the third and/or fourth doped region is performed at an oblique angle of incidence between 20 and 50° in relation to a direction perpendicular to an upper face of the substrate.

According to one embodiment, the method comprises the formation of isolating trenches perpendicular to the vertical gate, the isolating trenches being formed before or after the vertical gate.

BRIEF DESCRIPTION OF THE SEVERAL VIEWS OF THE DRAWINGS

Some examples of embodiments of the present disclosure will be described below in relation with, but not limited to, the accompanying figures, in which:

FIGS. 1A, 1B previously described schematically represent longitudinal and transverse cross-sections of a semiconductor substrate in which a conventional memory cell comprising a variable impedance element is formed, FIG. 2 described above schematically represents the electric circuit of a memory array comprising memory cells with variable impedance element, such as the one in FIGS. 1A, 1B, FIG. 3 described above schematically represents a longitudinal cross-section of a semiconductor substrate in which a pair of conventional memory cells comprising a variable impedance element is formed, FIG. 4 described above schematically represents a longitudinal cross-section of a semiconductor substrate in which another conventional memory cell comprising a variable impedance element is formed, FIGS. 5A, 5B schematically represent longitudinal and transverse cross-sections of a semiconductor substrate in which memory cells are formed each comprising a variable impedance element, according to one embodiment, FIG. 6 schematically represents the electric circuit of a memory array comprising memory cells with variable impedance element, such as the one represented on FIGS. 5A, 5B, FIGS. 7A, 7B are top views of a substrate on which a memory array is formed, at different steps of manufacturing, according to one embodiment.

DETAILED DESCRIPTION

Figure 3:
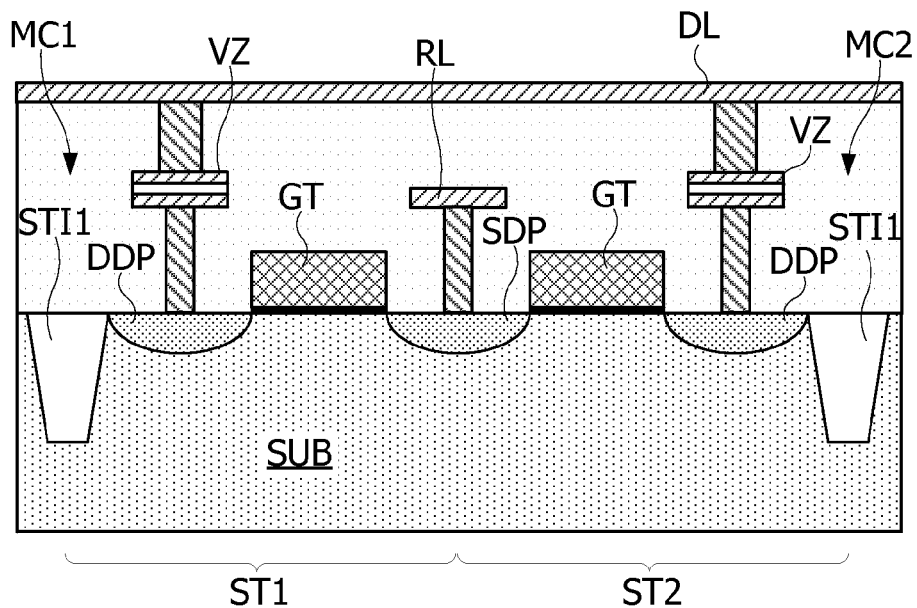
Figure 4:
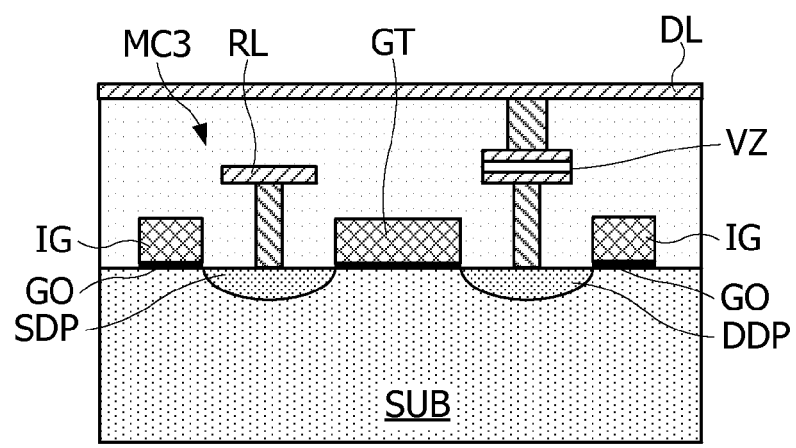
Figure 5A:
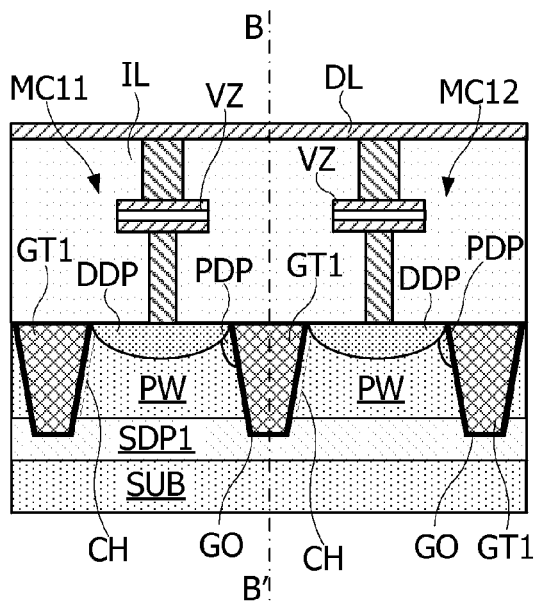
Figure 5B:
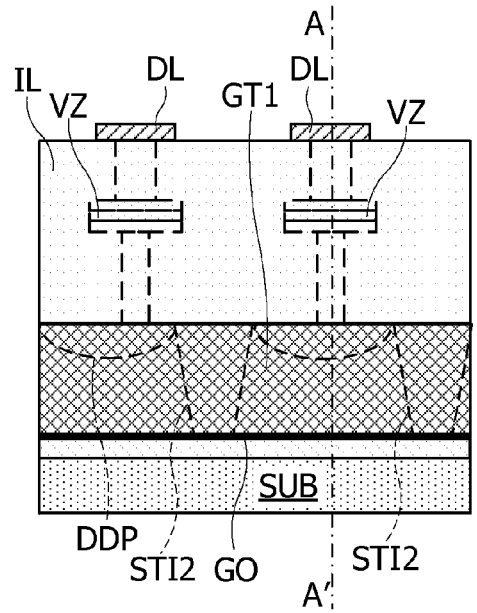

FIGS. 5A, 5B schematically represent a semiconductor substrate SUB in which two memory cells MC11, MC12 are formed, each comprising a variable impedance element VZ, according to one embodiment. FIG. 5A is a longitudinal cross-section along the plane AA' indicated on FIG. 5B, and FIG. 5B is a transverse cross-section along the plane BB' indicated on FIG. 5A. Each memory cell MC11, MC12 comprises a select transistor comprising a vertical gate GT1 formed in a trench produced in the substrate SUB, and conduction regions SDP1 and DDP. The gate GT1 comprises an insulating layer GO, for example oxide $SiO_2$, deposited or formed on the walls and the bottom of the trench and a conductive material such as the doped polycrystalline silicon filling the trench. The region DDP is produced by implanting dopants on the surface of the substrate SUB. The region SDP1 is produced by implanting dopants deep down in the substrate, so as to form a deep doped layer. Thus, the region SDP1 forms a well PW isolated from the rest of the substrate SUB between the region SDP1 and the upper face of the substrate. The region SDP1 forms a conduction region common to the select transistors of the two memory cells MC11, MC12. Each gate GT1 extends between the surface of the substrate SUB and the region SDP1, so as to form a channel region CH extending on one side of the trench in which the gate GT1 is formed, between the regions DDP and SDP1. The other side of each gate GT1 has received an implantation of dopants PDP chosen to prevent such a channel from forming at the usual control voltages of such memory cells. The memory cells MC11, MC12 are covered with a dielectric insulating material IL which can also be oxide $SiO_2$. The variable impedance element VZ is formed in the insulating layer IL and is coupled to the conduction region DDP through a contact formed in the insulating layer IL. The variable impedance element VZ is coupled to a data line DL formed on the surface of the layer IL through a contact formed in the insulating layer IL. The elements VZ of the two memory cells MC11, MC12 are coupled to the same data line DL, whereas the two memory cells MC11, MC12 are coupled to the conduction region SDP1 forming a common reference line CRL, each memory cell comprising its own selection gate GT1. The implantation of dopants PDP prevents two memory cells connected to a same data line DL from being accessed at the same time by a same selection line SL.

The variable impedance element VZ may have the structure of a capacitor comprising electrodes and, between the electrodes, a solid electrolyte or a dielectric material capable of forming filaments under the effect of a voltage applied between the electrodes, or a ferromagnetic material, or even a material which can take amorphous and crystalline phases.

The memory cell structure that has just been described enables a significant gain of substrate surface thanks to the formation of the vertical channel CH for the select transistor, thanks to the removal on the substrate surface of one of the two conduction regions of the select transistor, which is formed deep down in the substrate, and thanks to the use of the vertical gates GT1 which perform both the functions of selection gate and isolation from the neighboring memory cell, thanks to the doped region PDP.

It shall be noted that the conduction regions DDP, SDP1 of the select transistor may indifferently form a drain terminal and a source terminal of the select transistor ST11, ST12, and that the functions of the data DL and reference lines may be inverted.

Figure 6:
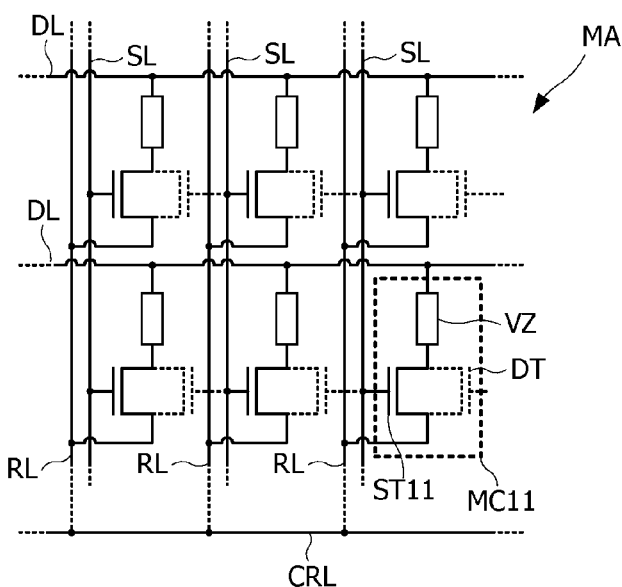

FIG. 6 is a wiring diagram of a memory array comprising several memory cells, such as the memory cells MC11, MC12. The memory array comprises selection lines SL, reference lines RL parallel to the selection lines SL and data lines DL perpendicular to the selection lines SL and to the reference lines RL. Each memory cell MC11 comprises a select transistor ST11 such as the one represented on FIGS. 5A, 5B. The transistor ST11 comprises a conduction terminal (source or drain) connected to a terminal of a variable impedance element VZ the other terminal of which is connected to one of the data lines DL. The other conduction terminal (drain or source) of the select transistor ST11 is connected to one of the reference lines RL, and the gate terminal of the transistor ST is connected to one of the selection lines SL. The reference lines RL are coupled to the common reference line CRL. FIG. 6 also shows the transistors DT that have been removed by the formation of the doped regions PDP.

Figure 7A:
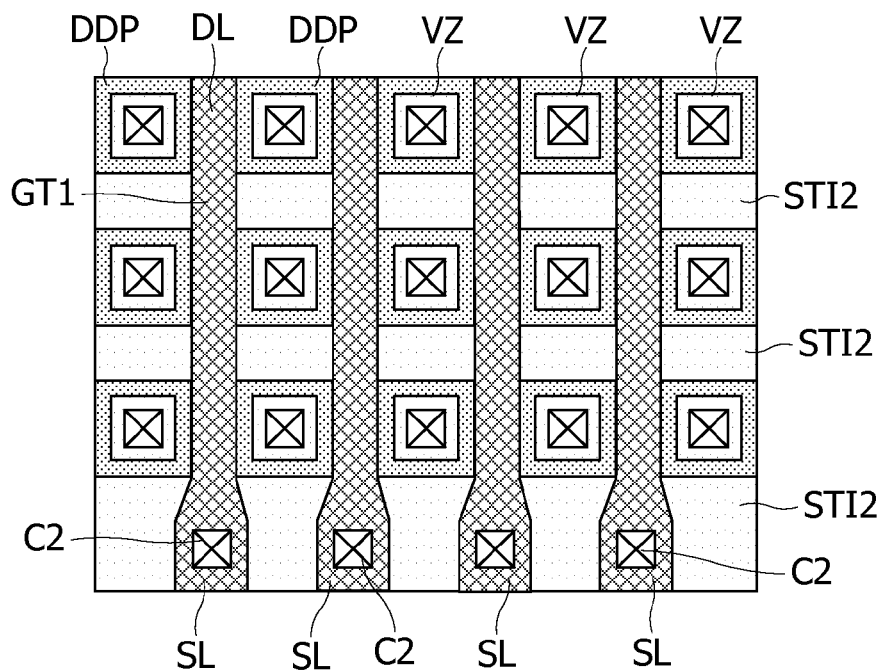
Figure 7B:
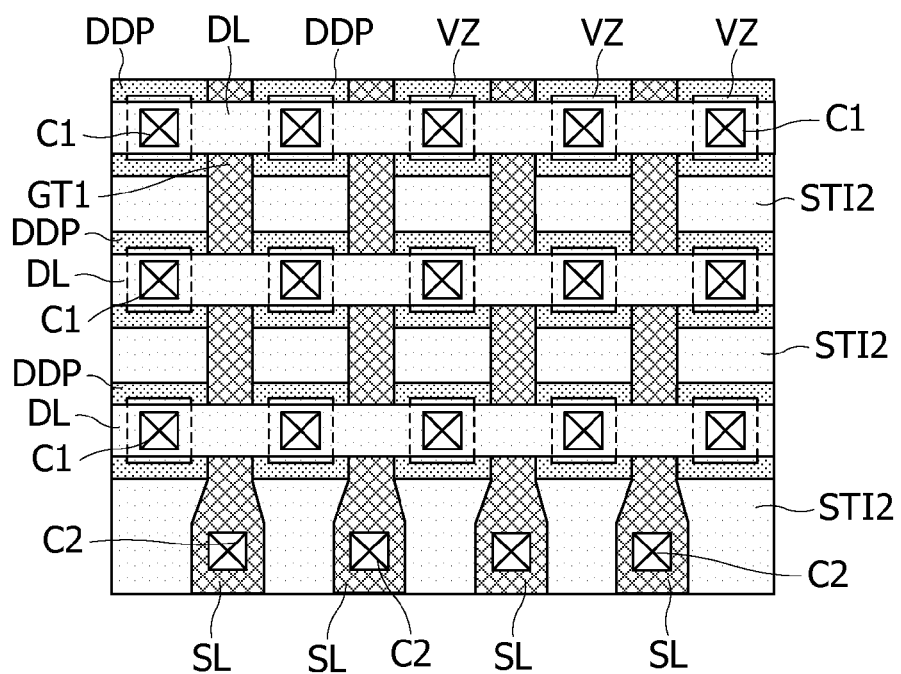

FIGS. 7A, 7B represent a portion of the substrate SUB on which several memory cells of the memory array MA are formed. FIG. 7A represents the substrate after formation of the variable impedance elements VZ. FIG. 7B represents the substrate after formation of the data lines DL coupling the variable impedance elements VZ. In the embodiment shown by FIGS. 5B and 7A, the isolating trenches STI2 are produced in the substrate SUB before the trenches in which the gates GT1 are formed. Thus the gates GT1 cut the isolating trenches STI2 and can thus form the selection lines SL as represented on FIG. 6. The gates GT1 may comprise contacts C2 on the edge of the memory array MA. The data lines DL have contacts C1 for example formed above the elements VZ.

Figure 8A:
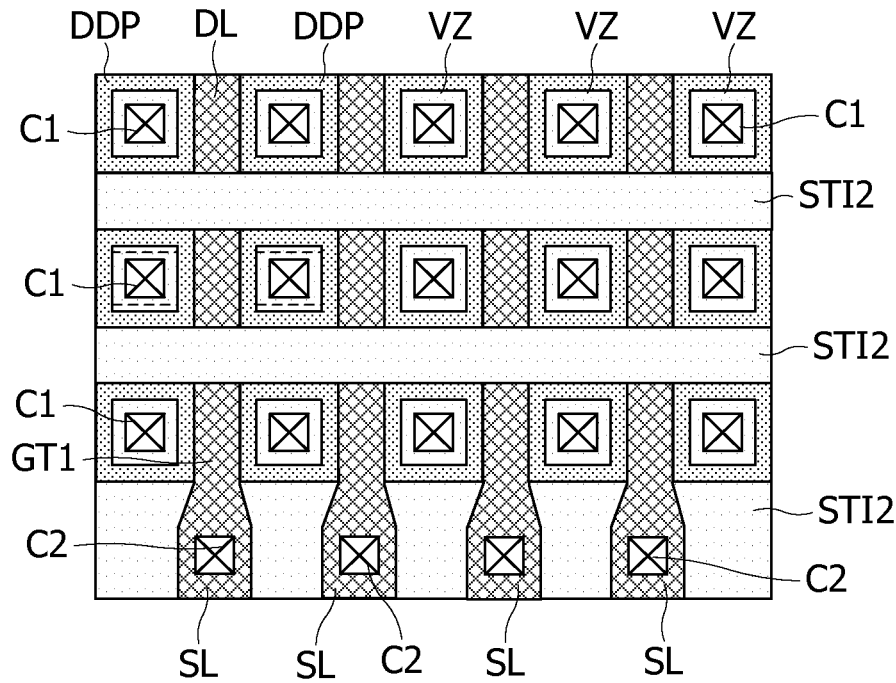
FIGS. 8A, 8B are top views of a substrate on which a memory array is formed, at different steps of manufacturing, according to another embodiment, FIGS. 9A to 9H schematically represent a longitudinal cross-section of a semiconductor substrate, showing steps of a method for manufacturing a memory cell such as the one in FIGS. 5A, 5B, FIGS. 10A and 10B schematically represent a longitudinal cross-section of a semiconductor substrate, showing steps of a method for manufacturing a memory cell, according to another embodiment.
Figure 8B:
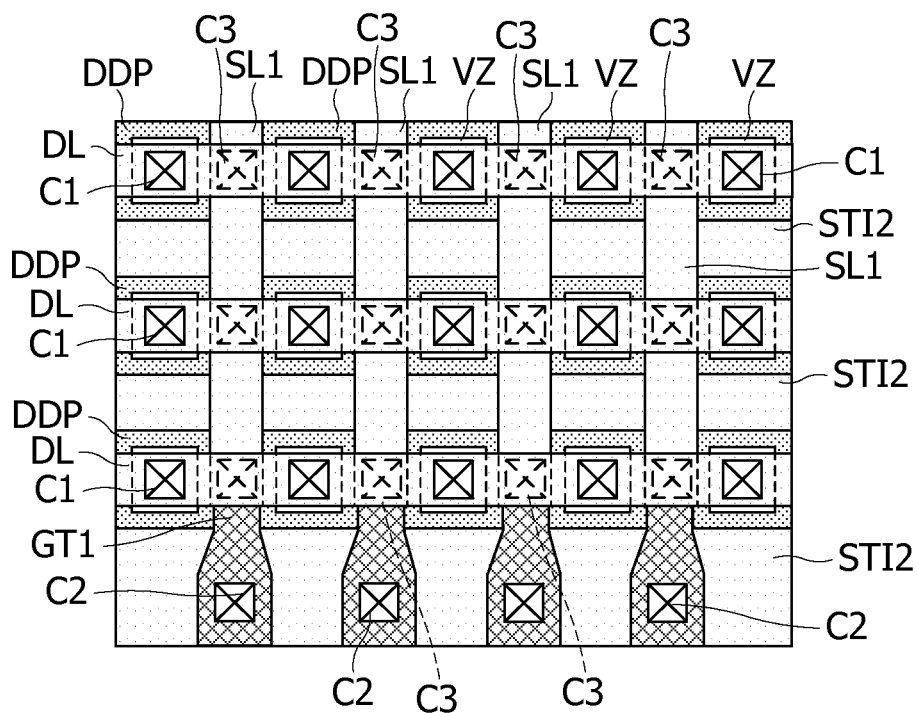

FIGS. 8A, 8B represent a portion of the substrate SUB on which several memory cells of the memory array MA are formed. FIG. 8A represents the substrate after formation of the variable impedance elements VZ. FIG. 8B represents the substrate after formation of the data lines DL coupling the variable impedance elements VZ. The embodiment shown by FIG. 8A differs from the one shown by FIG. 7A in that the isolating trenches STI2 are produced in the substrate SUB after the trenches in which the gates GT1 are formed, such that the isolating trenches STI2 cut the gates GT1 into sections. Thus, the memory cells are formed in mini-wells isolated from each other and from the substrate SUB. On FIG. 8B, selection lines SL1 are formed above the gate sections GT1 in an interconnection layer for example located between the upper face of the substrate SUB and the interconnection layer in which the data lines DL are formed. The selection lines SL1 are connected to the gate sections GT1 by links C3.

Figure 9A:
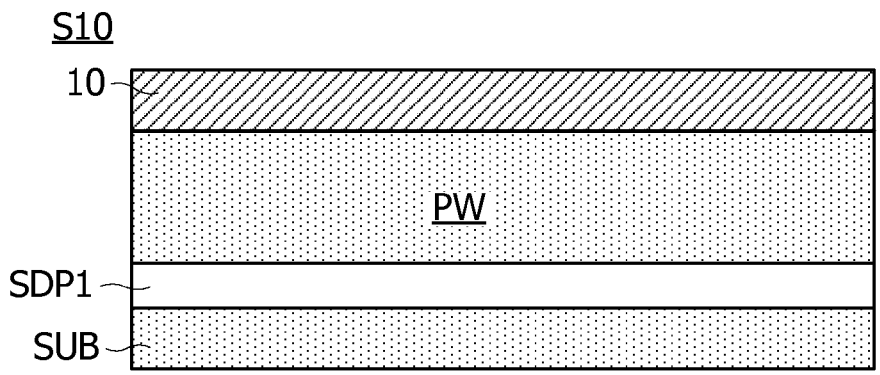

FIGS. 9A to 9H show steps of a method for manufacturing the memory cells MC11, MC12, according to one embodiment. FIGS. 9A to 9G represent the semiconductor substrate SUB in a longitudinal cross-section. FIG. 9A shows steps S10 of implanting dopant deep down in the substrate SUB to form the layer SDP1, and of depositing on the well PW thus isolated from the substrate SUB by the layer SDP1, a layer 10 intended to form an etching resist, comprising for example a layer of light-sensitive resin.

Figure 9B:
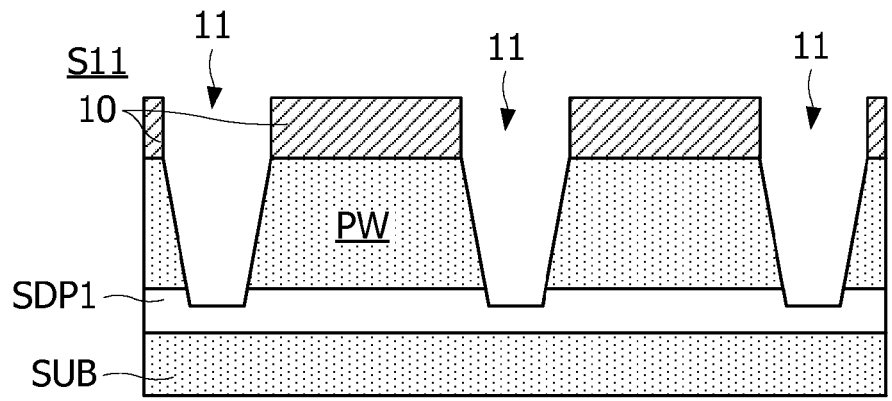
Figure 9C:
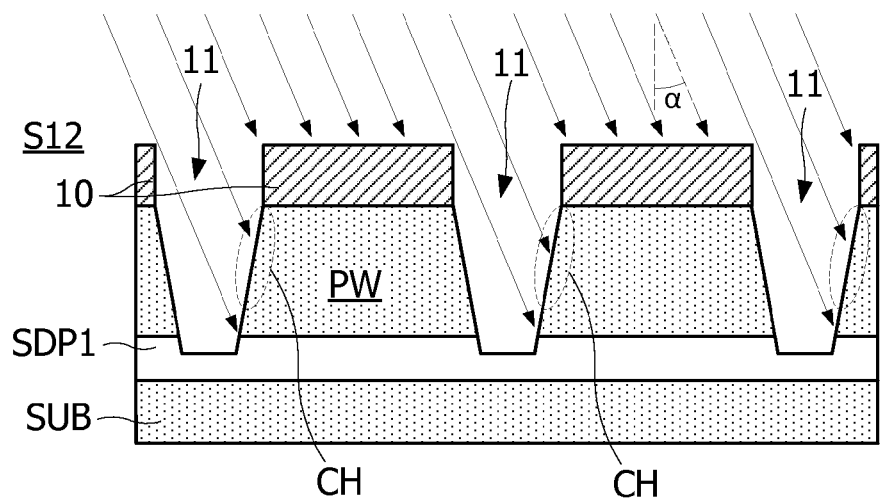

FIG. 9B shows steps S11 of etching the layer 10 and the well PW to form trenches 11. The trenches 11 are formed in the well PW until the layer SDP1 is reached. FIG. 9C shows a step S12 of implanting dopants to form the channels CH of the select transistors ST11. The dopants are implanted at an oblique angle of incidence α calculated according to the geometry to reach a lateral wall of each trench 11, the layer 10 still being present on the substrate SUB outside the trenches 11. The angle of incidence α can range between 20 and 50°, for example between 30 and 40°, in relation to a direction perpendicular to the surface of the substrate SUB. The dopants may be of P– type (for example using boron) if the substrate is of P type to form a region. It shall be noted that the step S12 can be optional and depends on the conductivity of the well PW.

Figure 9D:
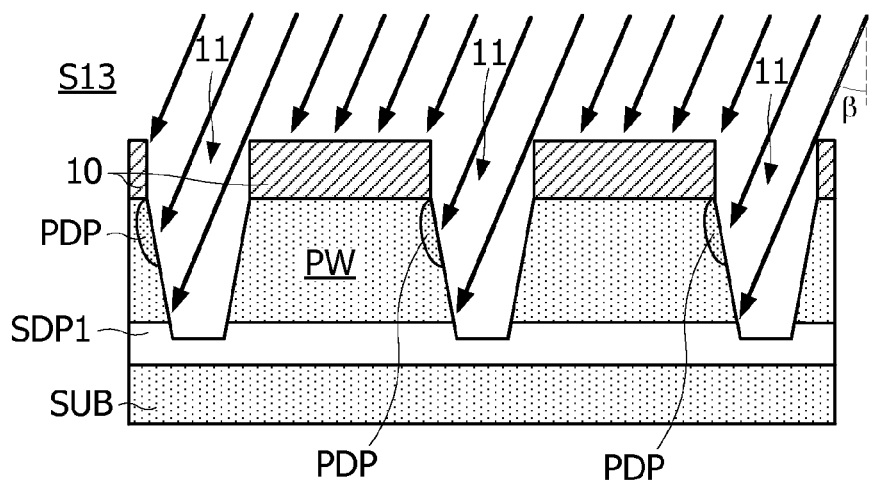

FIG. 9D shows a step S13 of implanting dopants via the other lateral wall of the trenches 11 to form the doped regions PDP. The doped regions PDP prevent the opening of a transistor channel along the other lateral wall of the trench, by increasing the threshold voltage of the transistor to a value such that it never becomes on at the usual voltages applied to the memory cells. The dopants are implanted at an oblique angle of incidence β calculated according to the geometry to reach the lateral wall of each trench 11, opposite the wall along which the transistor channel CH extends, the layer 10 still being present on the substrate SUB outside the trenches 11. The angle β can range between –20 and –50°, for example between –30 and –40°, in relation to a direction perpendicular to the surface of the substrate SUB. The dopants may be of P type (for example using higher concentrations of boron) if the substrate is of P type. The doping thus performed may enable a transistor threshold voltage ranging between 4 and 6 times the threshold voltage of the select transistors ST to be reached, for example 5 times this threshold voltage.

It shall be noted that the oblique implantations performed during the steps S12 and S13 (FIGS. 9C and 9D) can be performed between the etching of the layer 10 and the etching of the substrate SUB to form the trenches 11.

Figure 9E:
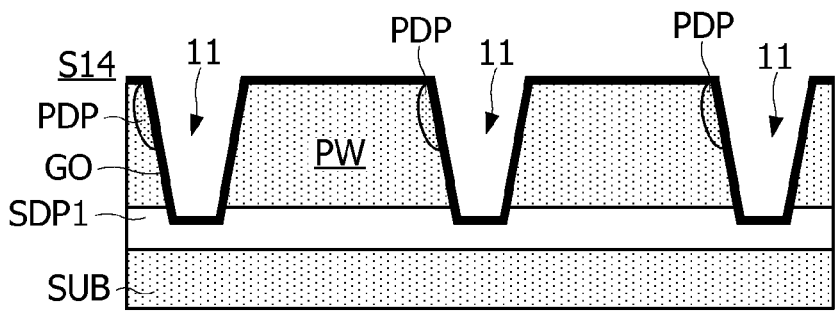
Figure 9F:
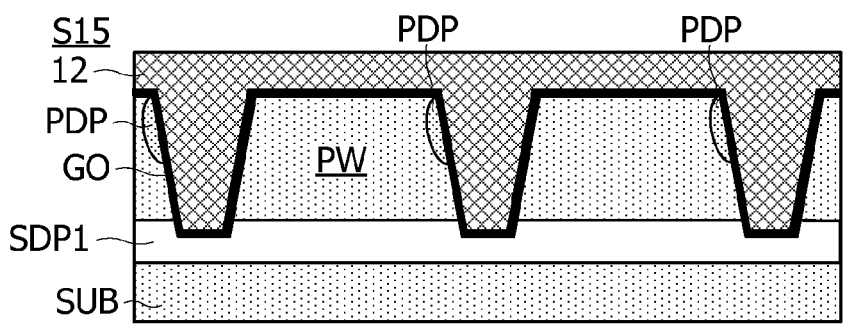
Figure 9G:
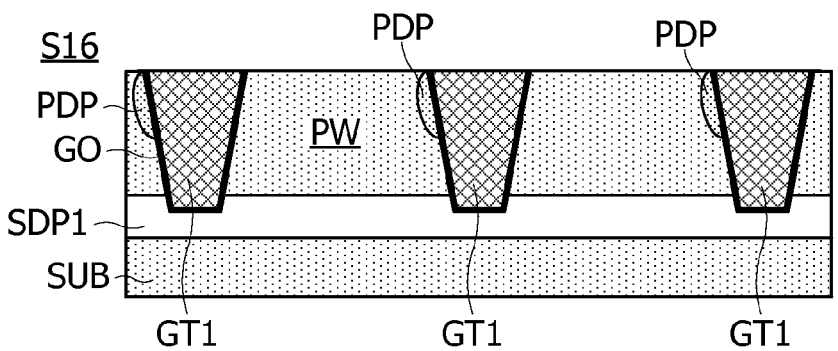
Figure 9H:
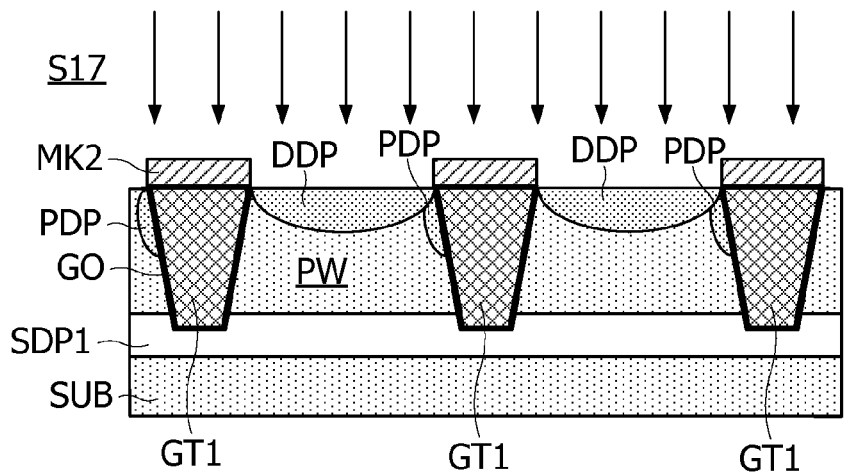

FIG. 9E shows steps S14 of removing the layer 10 and of depositing or increasing a dielectric layer on the surface of the substrate SUB and on the walls and the bottom of the trenches 11, to form the layer of gate oxide GO. FIG. 9F shows a step S15 of depositing a conducting layer 12, for example made of polycrystalline silicon, on the substrate SUB and in the trenches 11, to form the vertical gates GT1. FIG. 9G shows a step S16 of removing the layer 12 and the layer GO on the surface of the substrate SUB, this operation being performed without removing these layers from the trenches 11 (for example by CMP—Chemical-Mechanical Planarization—or by Etch Back). FIG. 9H shows a step S17 of forming the doped regions DDP between the gates GT1 and the trenches STI2, by implanting dopants through a mask MK1. The regions DDP are for example of N+ type if the well PW is of P type.

Figure 10A:
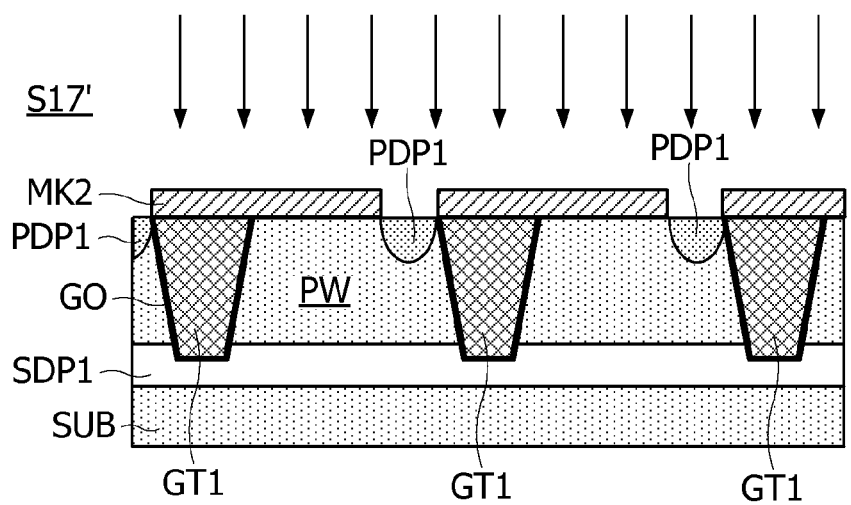
Figure 10B:
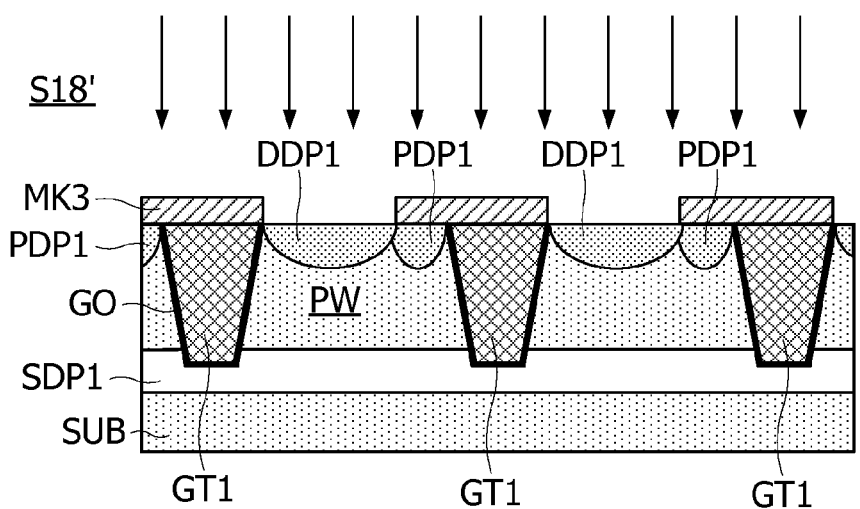

FIGS. 10A, 10B represent steps of a method for manufacturing the memory cells, according to another embodiment. According to another embodiment, the steps S12, S13 and S17 are removed and replaced with steps S17' and S18'. FIG. 10A shows the step S17' of implanting doped regions PDP1 (replacing the regions PDP) provided for preventing the appearance of a transistor channel on one side of the gates GT1. The regions PDP1 are produced by (vertically) implanting P-type dopants (for example using a high concentration of boron) through a mask MK2 leaving the substrate SUB visible in the vicinity of one side of the gates GT1. FIG. 10B shows the step S18' of implanting doped regions DDP1 (replacing the regions DDP). The regions DDP1 are produced by (vertically) implanting N+-type dopants through a mask MK3 leaving the substrate SUB visible in the vicinity of another side of the gates GT1.

It shall also be noted that the implantations performed during the steps S17' and S18' (FIGS. 10A and 10B) may be performed before the formation of the trenches 11.

It will be understood by those skilled in the art that the present disclosure is susceptible of various alternative embodiments and various applications. In particular, the disclosure is not limited to a memory comprising the regions PDP enabling the appearance of a transistor channel to be prevented. Indeed, other means may be used to prevent such a channel from appearing along a lateral face of the embedded vertical gates. Thus, an isolating trench can be formed on one side of and along the vertical gate. Furthermore, if the memory comprises only one row of memory cells on one side of a vertical gate, it may not be necessary to isolate the other side of the vertical gate from the rest of the well PW.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory on a semiconductor substrate, comprising:
a data line,
a selection line,
a reference line,
a memory cell that includes a variable impedance element and a select transistor having a control gate electrically coupled to the selection line, a first conduction terminal electrically coupled to the variable impedance element, the select transistor and the variable impedance element coupling the reference line to the data line, wherein:
the select transistor comprises a deep first doped region buried in the substrate,
the first conduction terminal is a second doped region on a surface of the substrate and electrically coupled to the variable impedance element,
the control gate is an embedded vertical gate produced in a trench formed in the substrate, and
the select transistor includes a channel region opposite a first face of the trench and extending between the first doped region and the second doped region.

2. The memory according to claim 1, wherein the first doped region is a portion of the reference line.

3. The memory according to claim 1, comprising a third doped region formed in the substrate opposite a second face of the trench and configured to prevent the opening of a transistor channel opposite the second face of the trench at voltages applied to control the memory cell.

4. The memory according to claim 1, comprising a third doped region implanted near a second lateral face of the embedded vertical gate, opposite the first lateral face, to favor the formation of a transistor channel at the control voltages applied to the memory cell, between the first doped region and the second doped region along the second lateral face of the gate.

5. The memory according to claim 1, wherein the variable impedance element is a capacitor that includes electrodes and, between the electrodes, a solid electrolyte, or a dielectric material configured to form filaments in response to a voltage being applied between the electrodes, or a ferromagnetic material, or a material which can take amorphous and crystalline phases.

6. The memory according to claim 1, wherein the embedded vertical gate is a portion of the selection line.

7. The memory according to claim 1, wherein the memory cell is one of a plurality of memory cells positioned in miniwells isolated from each other and from the rest of the substrate, the selection line being formed above and coupled to control gates of a row of the memory cells.

8. A memory cell, comprising:
a variable impedance element; and
a select transistor having a first conduction terminal electrically coupled to the variable impedance element, a deep first doped region buried in a substrate, an embedded vertical gate produced in a trench formed in the substrate, and a channel region opposite a first face of the trench, the first conduction terminal being a second doped region adjacent to an upper surface of the substrate and the channel region extending between the first doped region and the second doped region.

9. The memory cell according to claim 8, comprising a third doped region formed in the substrate opposite a second face of the trench and configured to prevent the opening of a transistor channel opposite the second face of the trench at voltages applied to control the memory cell.

10. The memory cell according to claim 8, comprising a third doped region implanted near a second lateral face of the embedded vertical gate, opposite the first lateral face, to favor the formation of a transistor channel at the control voltages applied to the memory cell, between the first doped region and the second doped region along the second lateral face of the gate.

11. The memory cell according to claim 8, wherein the variable impedance element is a capacitor that includes electrodes and, between the electrodes, a solid electrolyte, or a dielectric material configured to form filaments in response to a voltage being applied between the electrodes, or a ferromagnetic material, or a material which can take amorphous and crystalline phases.

12. A memory, comprising:
a semiconductor substrate;
a data line,
a selection line,
a reference line,
a memory cell that includes a variable impedance element and a select transistor having a control gate electrically coupled to the selection line, a first conduction terminal electrically coupled to the variable impedance element, the select transistor and the variable impedance element coupling the reference line to the data line, wherein:
the select transistor comprises a deep first doped region buried in the substrate,
the first conduction terminal is a second doped region at an upper surface of the substrate and electrically coupled to the variable impedance element,
the control gate is an embedded vertical gate produced in a trench formed in the substrate,
the select transistor includes a channel region opposite a first face of the trench and extending between the first doped region and the second doped region, and
an insulating layer is positioned on the upper surface of the substrate and the variable impedance layer is positioned in the insulating layer.

13. The memory according to claim 12, wherein the first doped region is a portion of the reference line.

14. The memory according to claim 12, comprising a third doped region formed in the substrate opposite a second face of the trench and configured to prevent the opening of a transistor channel opposite the second face of the trench at voltages applied to control the memory cell.

15. The memory according to claim 12, comprising a third doped region implanted near a second lateral face of the embedded vertical gate, opposite the first lateral face, to favor the formation of a transistor channel at the control voltages applied to the memory cell, between the first doped region and the second doped region along the second lateral face of the gate.

16. The memory according to claim 12, wherein the variable impedance element is a capacitor that includes electrodes and, between the electrodes, a solid electrolyte, or a dielectric material configured to form filaments in response to a voltage being applied between the electrodes, or a ferromagnetic material, or a material which can take amorphous and crystalline phases.

17. The memory according to claim 12, wherein the embedded vertical gate is a portion of the selection line.

18. The memory according to claim 12, wherein the memory cell is one of a plurality of memory cells positioned in mini-wells isolated from each other and from the rest of the substrate, the selection line being formed above and coupled to control gates of a row of the memory cells.

* * * * *